(12) United States Patent
Huang et al.

(10) Patent No.: US 6,486,034 B1
(45) Date of Patent: Nov. 26, 2002

(54) METHOD OF FORMING LDMOS DEVICE WITH DOUBLE N-LAYERING

(75) Inventors: Chih-Feng Huang, Chu-Pei (TW); Kuo-Su Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 8 days.

(21) Appl. No.: 09/908,824

(22) Filed: Jul. 20, 2001

(51) Int. Cl.$^7$ .............................................. H01L 21/336
(52) U.S. Cl. ....................... 438/281; 438/291; 438/297; 438/197
(58) Field of Search .................. 438/197, 291, 438/297, 281, FOR 192

(56) References Cited

U.S. PATENT DOCUMENTS

| | | | |
|---|---|---|---|
| 5,517,046 A | * 5/1996 | Hsing et al. ................. | 257/336 |
| 5,548,147 A | 8/1996 | Mei ........................... | 257/333 |
| 5,852,314 A | 12/1998 | Depetro et al. .............. | 257/343 |
| 5,869,371 A | 2/1999 | Blanchard .................... | 438/268 |
| 6,069,034 A | 5/2000 | Gregory ....................... | 438/201 |
| 2002/0025961 A1 | * 2/2002 | Scarborough et al. ....... | 514/247 |
| 2002/0045301 A1 | * 4/2002 | Sicard et al. ................ | 438/197 |

* cited by examiner

*Primary Examiner*—George Fourson
*Assistant Examiner*—Suk-San Foong
(74) *Attorney, Agent, or Firm*—George O. Saile; Stephen B. Ackerman

(57) ABSTRACT

The tradeoff between breakdown voltage and on-resistance for LDMOS devices has been improved by having two epitaxial N– regions instead of the single epitaxial N– region that is used by devices of the prior art. The resistivities and thicknesses of these two N– regions are chosen so that their mean resistivity is similar to that of the aforementioned single N– layer. A key feature is that the lower N– layer (i.e. the one closest to the P– substrate) has a resistivity that is greater than that of the upper N– layer. If these constraints are met, as described in greater detail in the specification, improvements in breakdown voltage of up to 60% can be achieved without having to increase the on resistance. A process for manufacturing the device is also described.

11 Claims, 4 Drawing Sheets

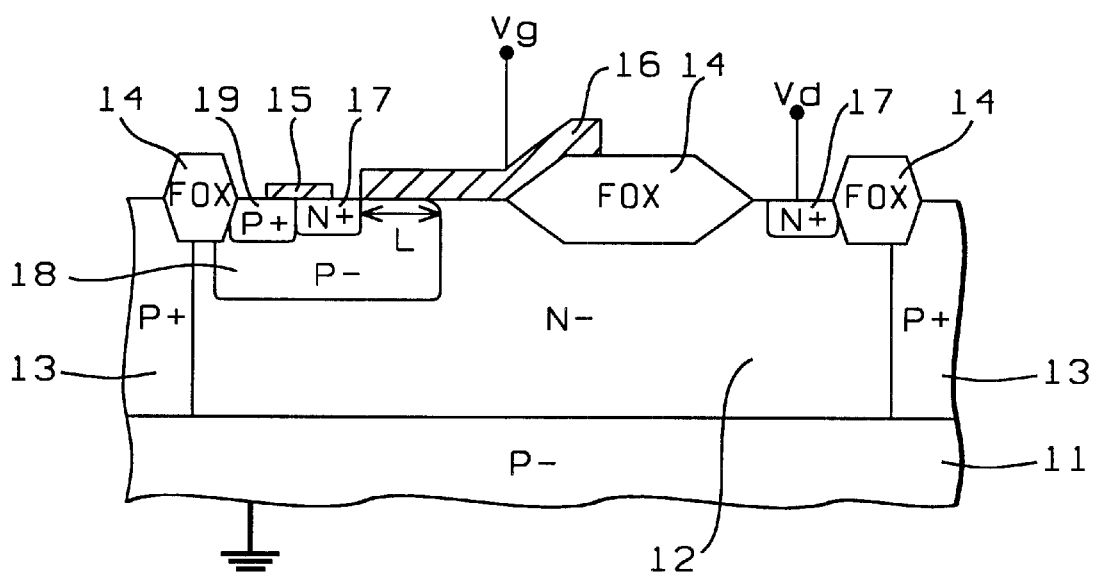
*FIG. 1 — Prior Art*

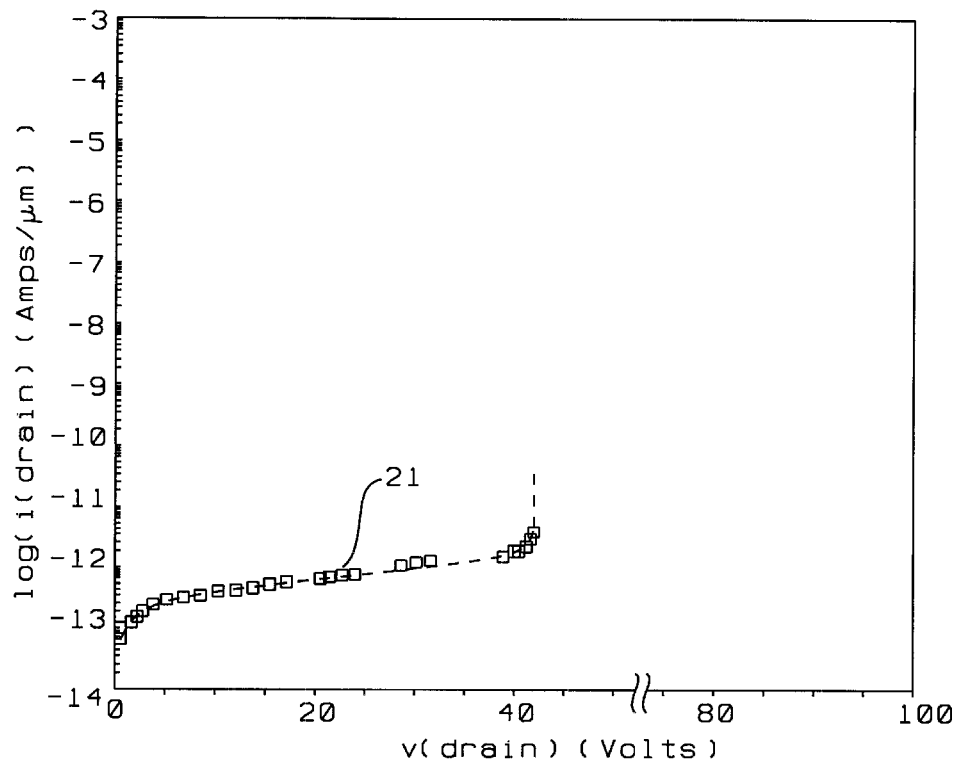
FIG. 2 – Prior Art
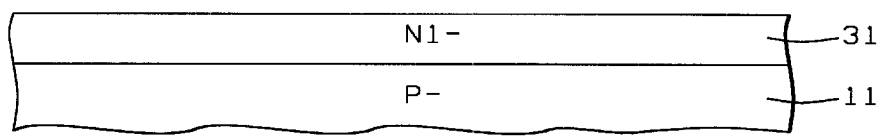
FIG. 3

METHOD OF FORMING LDMOS DEVICE WITH DOUBLE N-LAYERING

FIELD OF THE INVENTION

The invention relates to the general field of lateral diffused MOS (LDMOS) devices with particular reference to improving voltage breakdown without increasing on-resistance

BACKGROUND OF THE INVENTION

An LDMOS device is basically a MOSFET fabricated using a double diffusion process with coplanar drain and source regions. A typical structure of the prior art is shown in FIG. 1. N− body of silicon 12 (that typically has a resistivity between about 0.1 and 1 ohm-cm) is isolated from P− substrate 11 by P+ boundaries 13. P− well 18 extends dohwnwards from the top surface and includes N+ source 17 whose distance L from the junction between 12 and 18 defines the channel. With the application of positive voltage $V_G$ to polysilicon gate 16 (beneath which is a layer of gate oxide not explicitly shown), current can flow through the channel from source 17 into N− body 12 to be collected at N+ drain 17.

Metal contact 15 shorts source 17 to P+ ohmic contact 19 and thence to substrate 12. This allows source current to be applied through the substrate which can then be cooled through a heat sink. The role of field oxide regions 14 is to release electric field crowding at poly edge of drain side.

The on-resistance of devices of this type is roughly proportional to their breakdown voltage because the value of the latter is determined by the resistivity of N− region 12. Thus, a compromise has to be made between minimum on-resistance and maximum breakdown voltage. Additionally, the higher the on-resistance the lower the high frequency cutoff of the device.

FIG. 2 is a plot of drain current vs. drain voltage in the off state for a device of the type illustrated in FIG. 1 This device had an on-resistance of around 1.1 mohm.cm$^2$ and, as can be seen, breakdown has occurred at about 40 volts. The present invention discloses how the voltage breakdown of such a device may be raised by about 60% without having to increase the on-resistance.

A routine search of the prior art was performed with the following references of interest being found:

In U.S. Pat. No. 5,517,046, Hsing et al. disclose a DMOS device with a 2 step doping N− and N+ in an epi layer. As will become apparent, this invention teaches directly away from the present invention. Gregory, in U.S. Pat. No. 6,069,034, shows a DMOS with a buried drain that is connected to the surface through a sinker. U.S. Pat. No. 5,869,371 (Blanchard) discloses a VDMOS device similar to that of Hsing et al. U.S. Pat. No. 5,852,314 (Depetro et al.) and U.S. Pat. No. 5,48,147 (Mei) show related patents.

SUMMARY OF THE INVENTION

It has been an object of the present invention to provide an LDMOS device having significantly higher breakdown voltage, for the same on-resistance, than similar devices of the prior art.

This object has been achieved by having two epitaxial N− regions instead of the single epitaxial N− region that is used by devices of the prior art. The resistivities and thicknesses of these two N− regions are chosen so that their mean resistivity is similar to that of the aforementioned single N− layer. A key feature is that the lower N− layer (i.e. the one closest to the P− substrate) has a resistivity that is greater than that of the upper Nlayer. If these constraints are met, as described in greater detail in the specification, improvements in breakdown voltage of up to 60% can be achieved without having to increase the on-resistance.

BRIEF DESCRIPTION OF THE DRAWINGS

FIG. 1 is a cross-sectional view of an LDMOS device of the prior art.

FIG. 2 is a current-voltage plot, for a device such as that illustrated in FIG. 1, to show where breakdown occurs.

FIG. 3 shows the starting point of the process of the present invention.

DESCRIPTION OF THE PREFERRED EMBODIMENTS

We will disclose the present invention through a description of a process for its manufacture. In the course of said description the structure of the present invention will also become apparent. Referring now to FIG. 3, the present invention begins with the provision of P− substrate 11 and then depositing thereon a first epitaxial layer 31 of N− silicon to a thickness between about 1 and 3 microns, said layer having a resistivity that is between about 1 and 5 ohm-cm (designated N1− in the figure).

Figure 4:
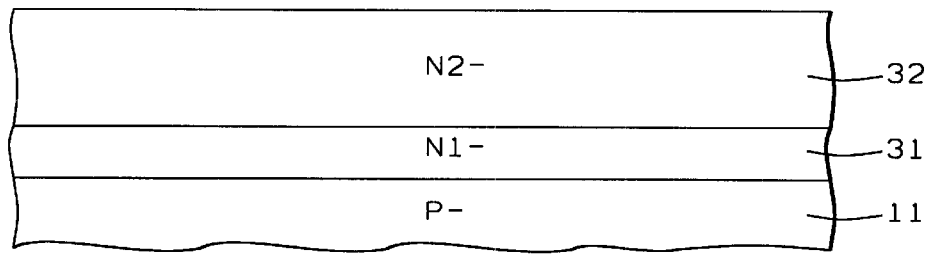
FIG. 4 shows the next, and crucial, step in the process of the present invention.

Referring next to FIG. 4, there now follows a key feature of the invention, namely the deposition of a second epitaxial layer 32 of N− silicon to a thickness between about 1 and 3 microns, said layer having a resistivity that is between about 0.1 and 0.5 ohm-cm (designated N2− in the figure). For the invention to work, it is essential that the second resistivity (N2−) be lower than first resistivity.

Our preferred process for performing the epitaxial depositions has been ASM, Toshiba, or Endura, but any process that yields high quality epitaxial silicon could have been used. We have also preferred to deposit both epitaxial layers (31 and 32) in a single pumpdown, with the change in resistivity being effected by changing the concentration of the dopant gas in the reactant mix with no other process disruption occurring, but formation of layers 31 and 32 could be done in two separate operations (with suitable protection of the surface of layer 31 between the operations) without changing the effectiveness of the present invention.

By the same token, it should be noted that the thickness and resistivity ranges specified above for layers 31 and 32 are critical for the final product to operate as claimed. If these guidelines are followed correctly, the mean resistivity of layers 31 and 32 will be between about 0.1 and 0.5 ohm-cm, which is approximately equal to that of an LDMOS device that has only a single N− epitaxial layer (such as layer 12 in FIG. 1).

Figure 5:
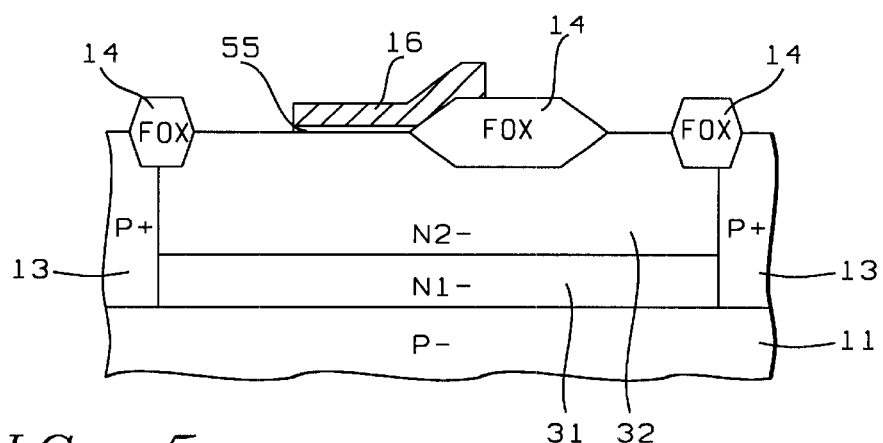
FIGS. 5 and 6 show additional steps in the process.

Once layers 31 and 32 are in place, manufacture of the device proceeds along conventional lines. As seen in FIG. 5, the next step is the formation of P+ junction isolation boundaries 13 that extends from the top surface of layer 32 all the way to P– substrate 11. Then, three areas 14 of field oxide are formed as shown and a layer of gate oxide 55 is grown. This is followed by the deposition of a layer of polysilicon which is patterned and etched (together with any unprotected gate oxide) to form gate pedestal 16.

Figure 6:
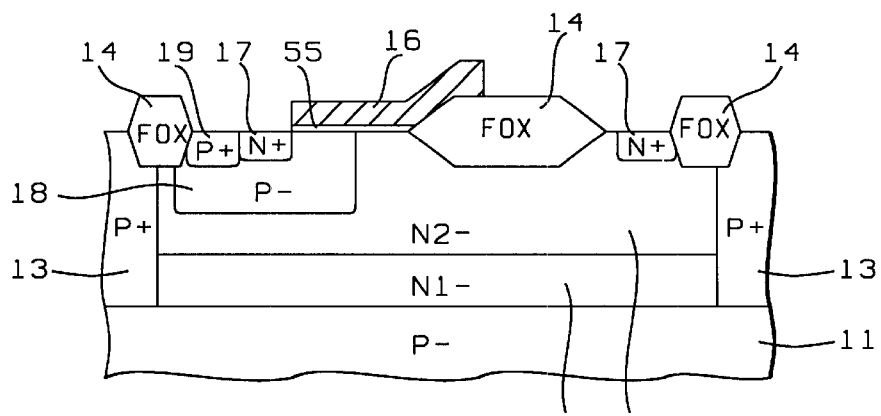

Referring now to FIG. 6, P– base region 18 is formed by means of ion implantation through a mask, followed by a drive-in diffusion. Again using ion implantation through a mask, N+ regions 17 are formed. One of the regions 17 is centrally located within P– base region 18, as shown, while the second N+ region 17 is located in the smaller of the two gaps between field oxide areas 14, also as shown in FIG. 6. Then by means of a third ion implantation through a mask, P+ region 19 is formed. It is also located within the Pbase region 18, being adjacent to, and abutting, first N+ region.

Figure 7:
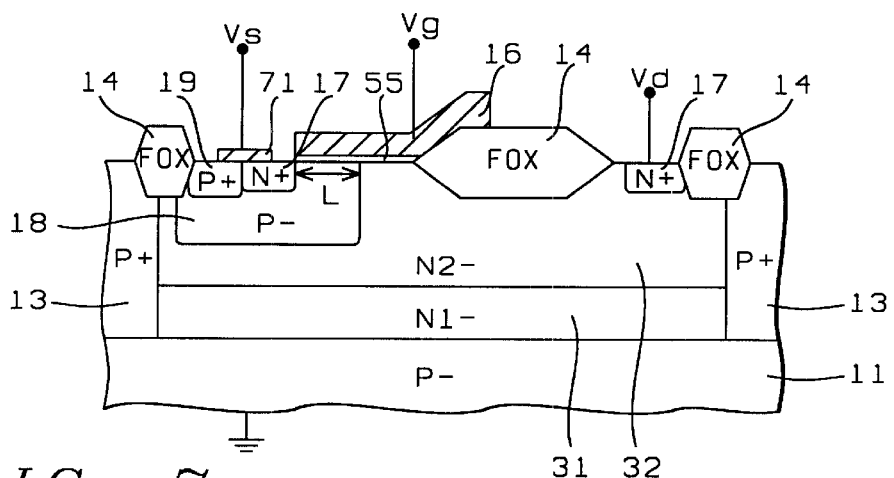
FIG. 7 is a cross-sectional view of the LDMOS device that is the end product of the process of the present invention.

Referring now to FIG. 7, metallic source, gate, and drain contacts are formed, including shorting bar 71 whose purpose was described earlier. Not explicitly shown is a layer of dielectric on which these contacts sit.

Figure 8:
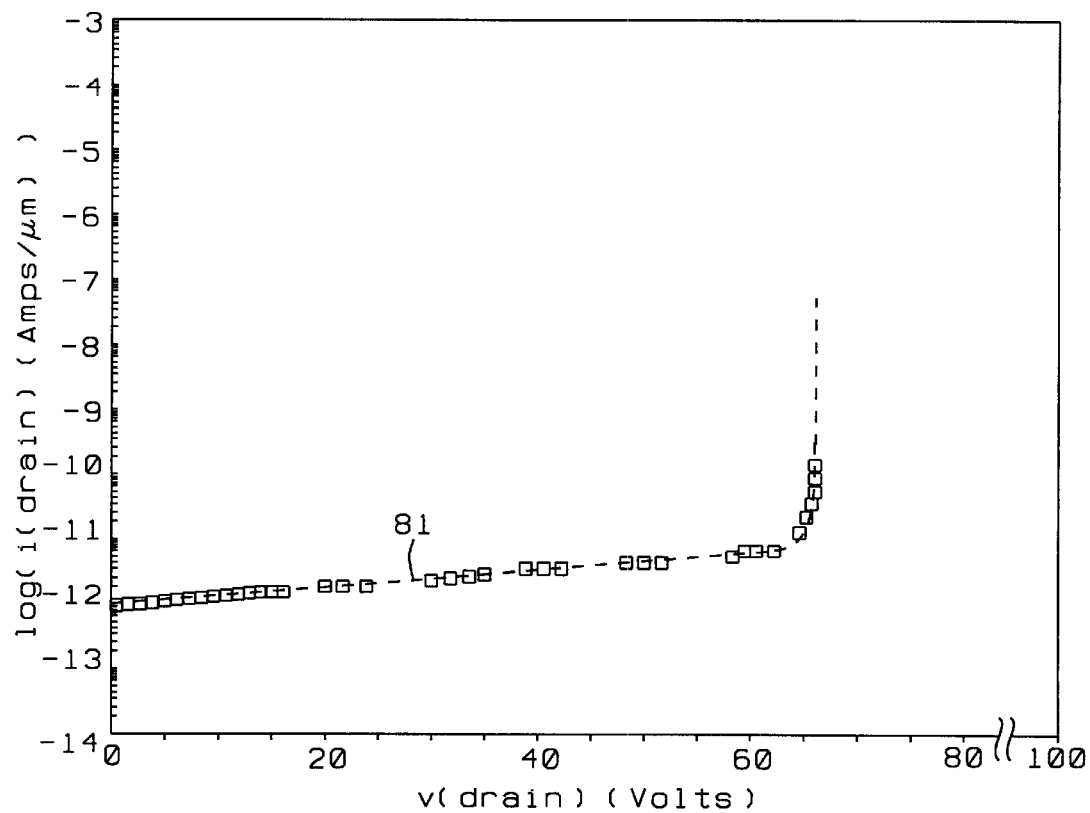
FIG. 8 is a current-voltage plot, for the device illustrated in FIG. 7, to show where breakdown occurs.

Confirmation of the effectiveness of the present invention was obtained by replotting the I–V breakdown curve, as shown in FIG. 8. As can be seen, curve 81 corresponds to an on-resistance of 1.1 mohm.cm$^2$, which is similar to that of the prior art device depicted in FIG. 2, but the breakdown voltage has increased to about 70 volts, representing an improvement of about 60% over the prior art.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing an LDMOS device, comprising:

providing a P– substrate;

on said substrate, depositing a first epitaxial layer of N– silicon having a first resistivity;

on said first epitaxial layer of N– silicon depositing a second epitaxial layer of N– silicon having an upper surface and a second resistivity that is lower than said first resistivity, whereby said first and second epitaxial layers have a mean resistivity that is approximately equal to that of an LDMOS device that has only one N– epitaxial layer;

forming a P– base region in the second epitaxial layer; and forming a layer of gate oxide covered by a polysilicon gate, an N+ source in the base region and an N+ drain in the second N– epitaxial layer.

2. The process described in claim 1 wherein the first epitaxial layer has a resistivity between about 1 and 5 ohm-cm.

3. The process described in claim 1 wherein the first epitaxial layer is deposited to a thickness between about 1 and 3 microns.

4. The process described in claim 1 wherein the second epitaxial layer has a resistivity between about 0.1 and 0.5 ohm-cm.

5. The process described in claim 1 wherein the second epitaxial layer is deposited to a thickness between about 1 and 3 microns.

6. A process for manufacturing an LDMOS device, comprising:

providing a P– substrate;

on said substrate, depositing a first epitaxial layer of N– silicon having a first resistivity;

on said first epitaxial layer of N– silicon depositing a second epitaxial layer of N– silicon having an upper surface and a second resistivity that is lower than said first resistivity;

forming a P+ junction isolation boundary that extends from said upper surface to the P– substrate;

forming two outer areas of field oxide, that lie within and touch the isolation boundary, and an inner area of field oxide that is separated from said outer areas by first and second gaps, the first gap being wider than the second gap;

on said upper surface, in the first gap, forming a layer of gate oxide;

on said layer of gate oxide, depositing, and then doping, a layer of polysilicon;

patterning said polysilicon, and all gate oxide not protected therewith, to form a gate pedestal;

by ion implantation through a mask followed by a drive-in diffusion, forming a P– base region that is located inside the larger gap and that extends downwards from said upper surface;

by ion implantation through a mask, forming a first N+ region that is centrally located within the P– base region, without underlying the gate oxide, and a second N+ region located in the second gap, both N+ regions extending downwards from said upper surface;

by ion implantation through a mask, forming a P+ region that is located within the P– base region adjacent to said first N+ region and extending downwards from said upper surface; and forming metallic source, gate, and drain contacts.

7. The process described in claim 6 wherein the first epitaxial layer has a resistivity between about 1 and 5 ohm-cm.

8. The process described in claim 6 wherein the first epitaxial layer is deposited to a thickness between about 1 and 3 microns.

9. The process described in claim 6 wherein the second epitaxial layer has a resistivity between about 0.1 and 0.5 ohm-cm.

10. The process described in claim 6 wherein the second epitaxial layer is deposited to a thickness between about 1 and 3 microns.

11. The process described in claim 6 wherein said first and second epitaxial layers have a mean resistivity between about 0.1 and 0.5 ohm-cm, this being approximately equal to that of an LDMOS device that has only a single N– epitaxial layer.

* * * * *